United States Patent
Akaogi et al.

(10) Patent No.: US 6,327,181 B1
(45) Date of Patent: Dec. 4, 2001

(54) REFERENCE CELL BITLINE PATH ARCHITECTURE FOR A SIMULTANEOUS OPERATION FLASH MEMORY DEVICE

(75) Inventors: Takao Akaogi, Cupertino; Tien-Min Chen, San Jose; Kazuhiro Kurihara, Sunnyvale, all of CA (US)

(73) Assignees: Advanced Micro Devices Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/421,775

(22) Filed: Oct. 19, 1999

(51) Int. Cl.[7] .................................................. G11C 16/04
(52) U.S. Cl. .................... 365/185.11; 365/182.2; 365/185.23; 365/230.08; 365/189.01; 365/189.09; 365/210
(58) Field of Search ................. 365/189.01, 230.01, 365/185.11, 185.2, 230.08, 185.23, 189.09, 210

(56) References Cited

U.S. PATENT DOCUMENTS

| | | | |
|---|---|---|---|
| 5,163,021 | * 11/1992 | Mehrotra et al. | 365/185 |
| 5,172,338 | * 12/1992 | Mehrotra et al. | 365/185 |
| 5,263,000 | 11/1993 | Buskirk et al. | 365/226 |
| 5,291,446 | 3/1994 | Buskirk et al. | 365/189.09 |
| 5,519,652 | * 5/1996 | Kumakura et al. | 365/185.21 |
| 5,612,921 | 3/1997 | Chang et al. | 365/226 |
| 5,708,387 | 1/1998 | Cleveland et al. | 327/536 |
| 5,841,696 | 11/1998 | Chen et al. | 365/185.11 |
| 5,847,998 | 12/1998 | Buskirk | 365/185.33 |
| 5,867,430 | 2/1999 | Chen et al. | 365/189.04 |
| 5,886,925 | * 3/1999 | Campardo et al. | 365/185.21 |
| 5,917,744 | * 6/1999 | Kirihata et al. | 365/63 |
| 5,917,753 | * 6/1999 | Dallabora et al. | 365/185.21 |
| 5,946,238 | * 8/1999 | Campardo et al. | 365/185.2 |
| 5,982,693 | * 11/1999 | Nguyen | 365/208 |
| 6,005,803 | 12/1999 | Kuo et al. | 365/185.11 |
| 6,016,270 | 1/2000 | Thummalapally et al. | 365/185.11 |
| 6,028,791 | * 2/2000 | Tandka | 365/185.21 |

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology."

AMD, Technology Background brochure, "3.0 Volt–only Burst Mode Flash Memory Technology."

AMD, Technology Background brochure, "1.8 Volt–only Flash Memory Technology."

AMD, Technology Background brochure, "AMD DL160 and DL320 Series Flash: New Densities, New Features."

* cited by examiner

Primary Examiner—Viet Q. Nguyen
(74) Attorney, Agent, or Firm—Wagner Murabito & Hao LLP

(57) ABSTRACT

A dual bank flash memory device including a reference path equalization circuits is disclosed. In the device, each bank includes a read path with an electrical characteristic. The device further includes a reference circuit which comprises a reference cell and reference paths which also have an electrical characteristic. The reference equalization circuits are coupled with the reference circuit which equalizes the read path electrical characteristics with the reference path electrical characteristics.

27 Claims, 8 Drawing Sheets

Fig. 5 RPATH_MID

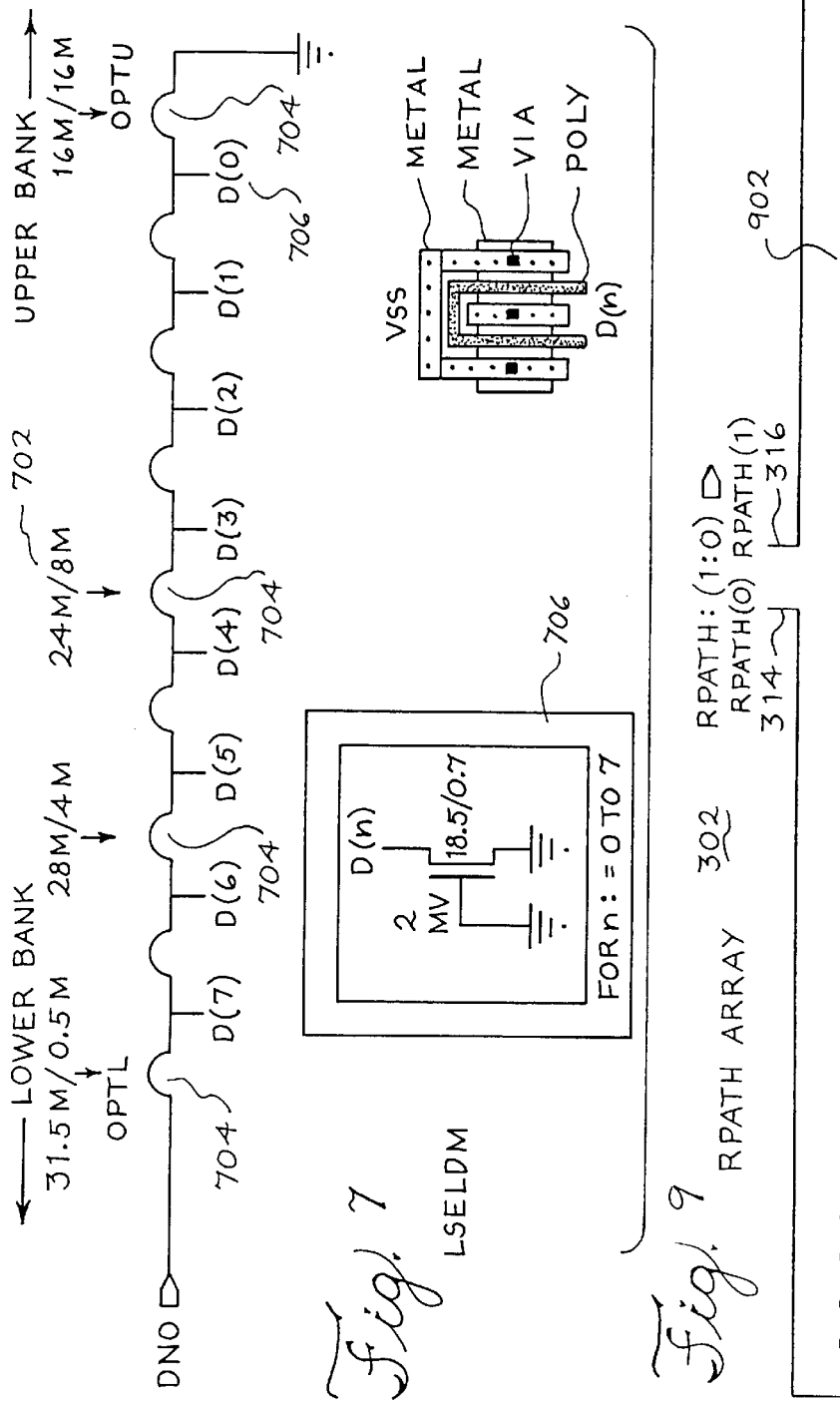
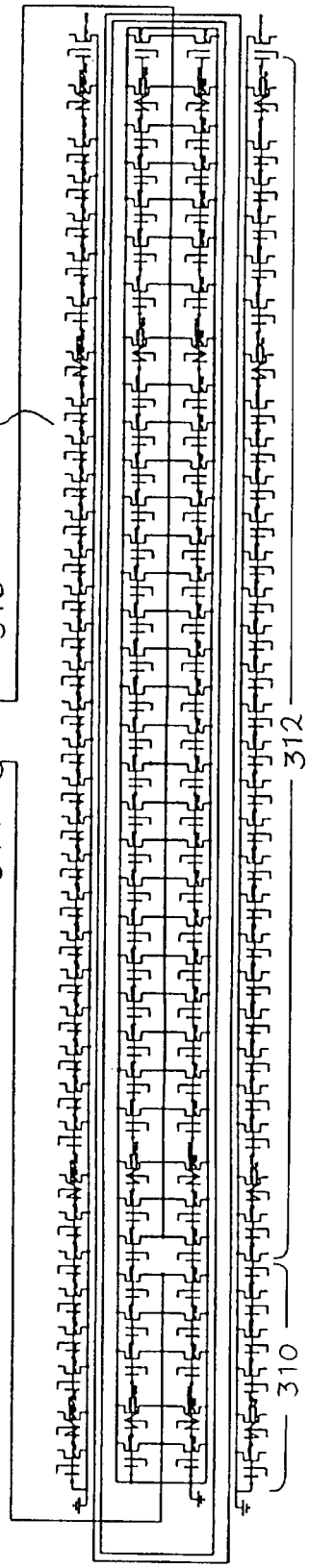

REFERENCE CELL BITLINE PATH ARCHITECTURE FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 micro-seconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to a dual bank flash memory device where each bank has a read path with an electrical characteristic. The device further includes a reference circuit which comprises a reference cell and reference paths which also have an electrical characteristic. In addition, the device includes reference equalization circuits, coupled with the reference circuit, which equalize the read path electrical characteristics with the reference path electrical characteristics.

By equalizing the electrical characteristics of the read path with the reference path, sense amplifiers coupled with both paths can achieve the fastest operation time to read correct data from the memory banks. Another advantage of the preferred embodiments is better immunity to fabrication process variations. Still another advantage to the preferred embodiments is the use of a single reference circuit, equalized for both banks, which saves layout/die area. Finally, the preferred embodiments provide the ability to easily optimize the implementation of the equalization circuits for future designs as well as easily optimize the equalization circuits during fabrication of current devices.

BRIEF DESCRIPTION OF THE DRAWINGS

FIG. 7 depicts a schematic diagram of the LSELDM circuit of FIG. 2.

FIG. 9 depicts a schematic diagram of the RPATH_ARRAY circuit of FIG. 2.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
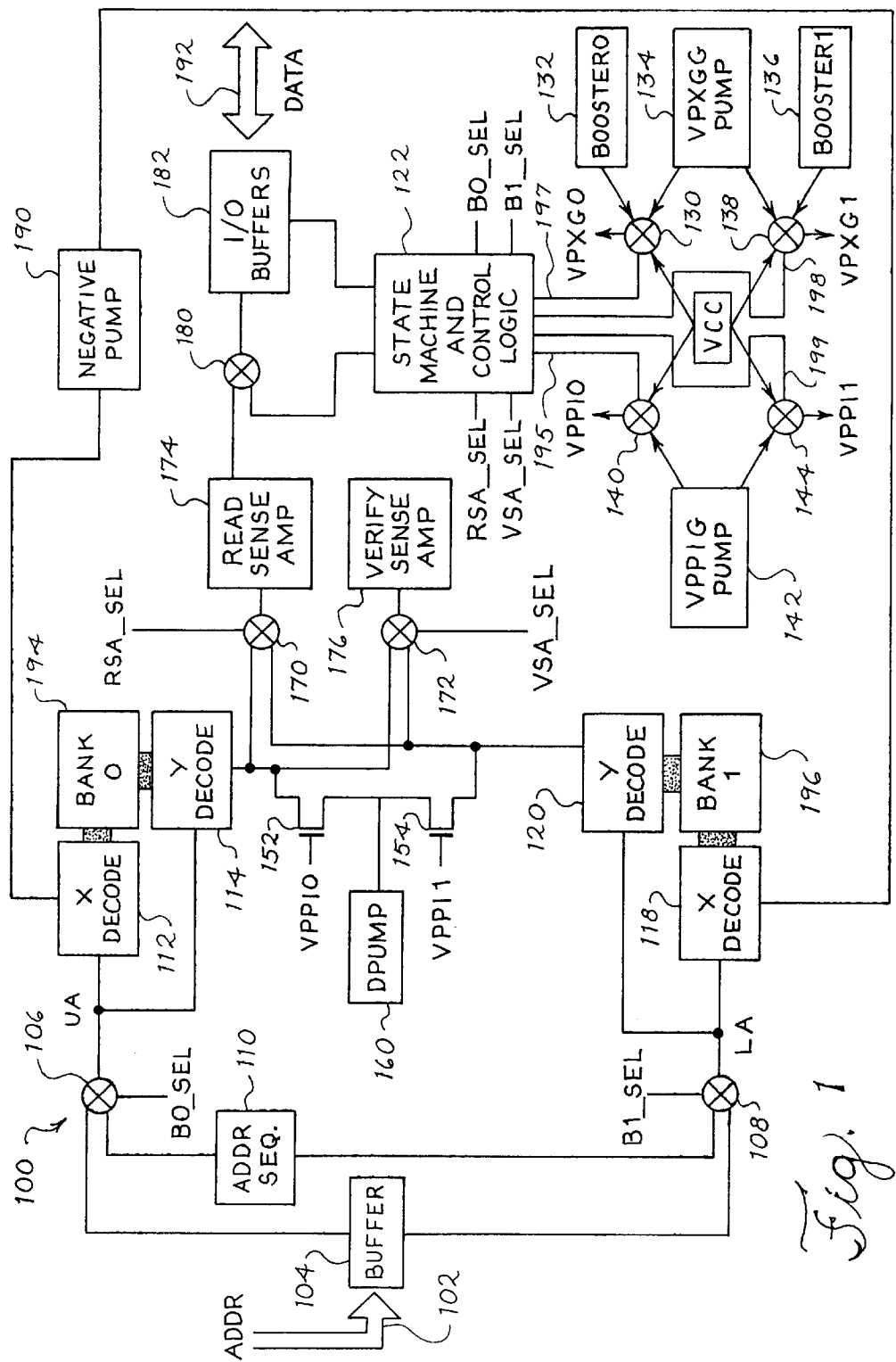
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 Further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

As used herein, the phrase "high logic level" is used to indicate a logical 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low" and labeled with a bar over the signal name or a B appended to the end of the signal name) and some signals are asserted when they are at a high logic level (also referred to as "active high"). It will be appreciated that all forms of digital logic representations are contemplated including mixed logic and multi-state representations. It will further be appreciated that the underlying voltages of the logic signals may also vary, with typical values being 2 or 3 Volts representing logic 1 and 0 Volts representing logic 0.

Figure 2:
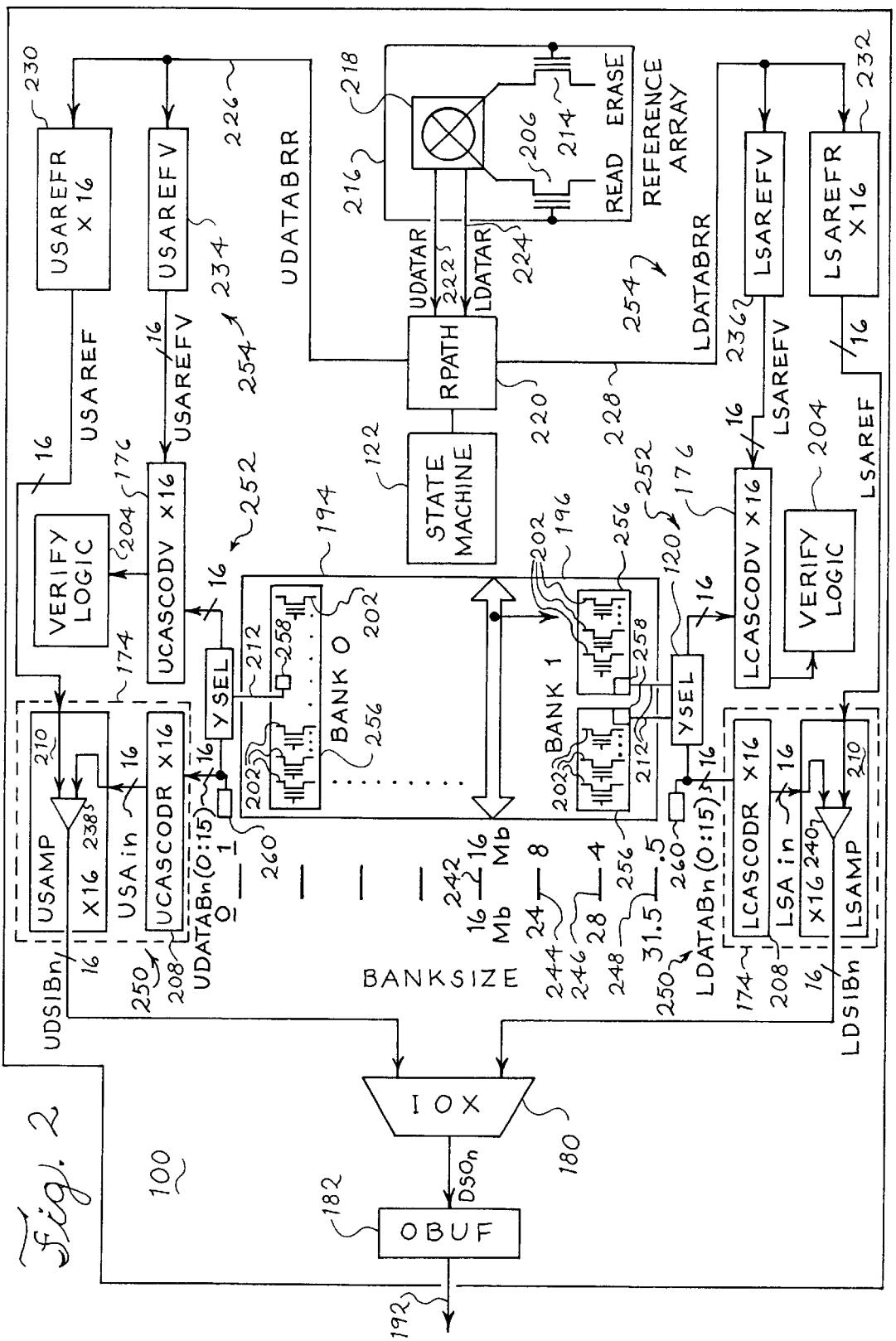
FIG. 2 schematically depicts the implementation of read/verify and reference paths for the flash memory chip of FIG. 1.

In one embodiment of the present invention, a reference path equalization circuit is provided to equalize the electrical characteristics of the reference path 254 of memory device 100 to those of the read path 250. Referring now to FIG. 2, there is shown a schematic diagram of the flash memory device 100 of FIG. 1 showing the read 250, verify 252 and reference 254 paths in more detail. For the sake of clarity, a number of the components of FIG. 1 have been deleted in FIG. 2. The read path 250 is the path of data flow from a core memory cell 202 to the outputs 192 of the memory device 100. The verify path 252 is the path of data flow from a core memory cell 202 to the verify logic 204. The reference path 254 is the path of data flow from the reference cells 206, 214 to the sense amplifiers 174. There is a read path 250, a verify path 252 and a reference path 254 for each bank 194, 196 of the memory device 100.

The read path 250 starts at the selected core cells 202 of the memory banks 194, 196 as selected by the address on the address inputs 102. Each core cell 202 is connected with a metal bit line 212 which interconnects all the core cells 202 of a particular column in the bank 194, 196. In addition, each core cell 202 is actually part of a sector 256. In the memory device 100, with a capacity of 32 Mb and a non-uniform or bootblock configuration, the memory banks 194, 196 are divided into 63 sectors 256, each with 64 kilobytes of storage ("large sectors") and 8 sectors 256, each with 8 kilobytes of storage ("small sectors"). It will be appreciated that in uniform configured devices 100, there are 64 sectors 256, each with 64 kilobytes of storage. Each byte includes 8 core cells 202, therefore a large sector 256 has 512 core cells 202 and a small sector 256 has 64 core cells 202. Each sector 256 has a sector selection transistor 258 which also forms part of the read path 250 and is used to select that particular sector for operating.

The metal bit lines 212 are coupled with the Y address decoders 114, 120 which selects which columns will be read. As was noted above, the X address decoders 112, 118 select which row is to be read from the memory banks 194, 196. The output of the Y address decoder 114, 120 is connected to the sense amplifiers 174 which determine the value of the data stored in the core cells 202 being read. This data is then passed to the input/output multiplexers 180, then to the input/output buffers 182 and ultimately to the data outputs 192 of the memory device 100. In the memory device 100, additional logic 260 used for programming and erasing core cells 202 is also attached to the output of the Y address decoders 114, 120 and is considered coupled with the read path.

The verify path 252 is almost the same as the read path 250 except that the outputs of the Y address decoders 114, 120 go to the verify sense amplifiers 176 and then to the verify logic 204 where the data in the cell 202 is verified against the data that was supposed to be written to the memory bank 194, 196.

The reference path 254 begins with either the reference read cell 206 or the verify reference cell 214 from the reference cell array 216 as selected by the reference cell selection logic 218. The reference cell selection logic 218 connects the appropriate cell 206, 214, for read (206) or verify (214) operations, with the appropriate bank 194, 196 undergoing that operation. This selection logic 218 allows one set of reference cells 216 to be used by the read/verify logic of two banks 194, 196. The appropriate reference cell 206 or 214 is connected to the reference path distribution logic 220 (labeled "RPATH") by the signal paths 222, 224 (labeled "UDATAR" for bank 194 and "LDATAR" for bank 196). It will be appreciated that one or both of the cells can be used at any given time when one bank 194, 196 is undergoing a read while the other bank 194, 196 is undergoing a verify. The reference path distribution logic 220 connects the reference cells 206, 214 to the read reference pre-amplifiers 230, 232 (labeled "USAREFR" and "LSAREFR") and the verify reference pre-amplifiers 234, 236 (labeled "USAREFV" and "LSAREFV") for the upper and lower banks, 194, 196 via signal paths 226, 228 (labeled "UDATABRR" for bank 194 and "LDATABRR" for bank 196).

The read sense amplifiers 174 of the memory device 100, of which there are 16 for the upper bank and 16 for the lower bank, each include two components, read pre-amplifiers 208 (labeled "UCASCODR" for bank 194, and "LCASCODR" for bank 196) and read sense amplifiers 210 (labeled "USAMP" for bank 194 and "LSAMP" for bank 196). The read sense amplifiers 208, 210 employ a differential sense amplifier circuit 238, 240 which compares the input from the core cell 202 with the input from the read reference cell 206. The read sense amplifier 208, 210 is then able to determine whether a logical 1 or a logical 0 is stored in the core cell. The verify sense amplifiers 176 operate in a similar fashion, however they do not have a pre-amplifier component.

In order for the differential sense amplifier circuits 238, 240 to function correctly and at the fastest speed, it is desirable that the electrical characteristics of the read path 250 and the reference path 254 be the same or nearly the same. These characteristics include parasitic capacitance, metal line capacitance (typically due to the bit line length) and loading. For example, if the reference path 254 and the read path 250 have mismatched metal line capacitance, one signal may be delayed, with reference to the other, in arriving at the inputs to the differential sense amplifier circuits 238, 240. In this case, the differential sense amplifier circuits 238, 240 are then subsequently delayed in computing the output result.

In memory device 100, the read path 250 comprises many components which affect the electrical characteristics of the read path 250. For example, as was discussed above, the memory device 100 groups core cells 202 together by sector. In the memory device 100 with a capacity of 32 Mb, there can be sixty three 64 kilobyte sectors (also known as "large sectors") and eight 8 kilobyte sectors (also known as small sectors) in a device 100 configured with a bootblock configuration. In a large sector then, there are 512 core cells 202 and in a small sector there are 64 core cells 202. Core cells 202, which are connected to the read path by their drains, introduce parasitic capacitance into the read path 250. Parasitic capacitance is one of the electrical characteristics which must be matched by the reference path. Therefore, large sectors will have a larger parasitic capacitance than small sectors. When reading from a large or small sector, it is desirable that the reference path 254 have the same parasitic capacitance. In the memory device 100, all 8 small sectors are located in bank 196.

In addition, the sliding bank architecture adds further complexities to the read path 250. As was described above, the sliding bank architecture permits variations in the distribution of the total memory capacity across the two memory banks 194, 196. In the memory device 100, the memory banks 194, 196 are implemented as one continuous memory bank which can be split into upper and lower banks 194, 196 by appropriate modifications to the second metal layer of the fabrication process. If the banks 194, 196 are split across the middle, each bank will have one half of the total memory capacity of the device 100. In the device 100, the split between the banks can be placed to achieve the following bank sizes (bank 194/bank 196): 16 Mb/16 Mb 242, 24 Mb/8 Mb 244, 28 Mb/4 Mb 246 and 31.5 Mb/0.5 Mb 248.

As can be seen, the placement of the split between the banks 194, 196 will affect the physical size of the banks 194, 196. One aspect of the physical bank size is the length of the metal bit lines 212 which connect the core cells 202 in a column. As the sizes of the banks 194, 196 change, the metal bit line 212 lengths will also change, getting longer in the case of bank 194 and shorter in the case of bank 196. The length of the metal bit line 212 affects the capacitance of the read path 250 and therefore must be matched by the reference path 254.

Another aspect of the physical size of the banks is the number of sectors 256 contained within each bank. In this case, the sliding bank architecture also affects the number of sector selection transistors 258 coupled with the read path 250. The larger the bank 194, 196 size, the more sectors 256 and the more sector selection transistors 258. This effects the loading of the read path, where the loading is the number of transistors with gates attached to the read path. This loading must be matched by the reference path 254.

Figure 3:
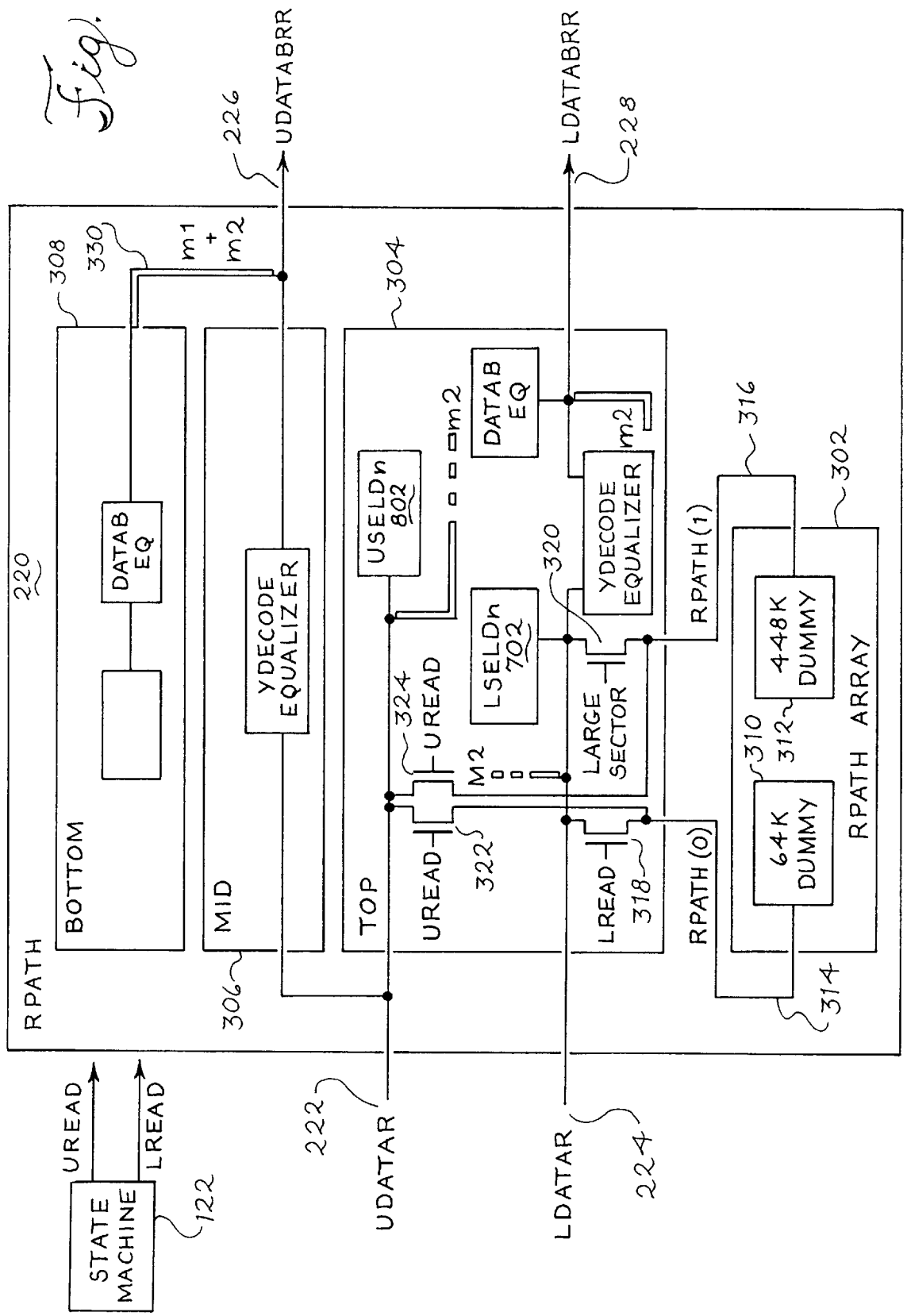
FIG. 3 depicts a schematic diagram of a preferred embodiment reference path for the flash memory chip of FIG. 2.

In order to equalize the parasitic capacitance, varied metal bit line 212 lengths and varied loading, the RPATH circuit 220 is provided which includes equalization circuits to equalize the electrical characteristics of the reference path 254 with those of the read path 250. It is desirable that the equalization circuits, which are used to match those electrical characteristics which vary with the sliding bank architecture, also be able to be adjusted accordingly in the same manner as the bank size, utilizing the second metal layer of the fabrication process. Referring now to FIG. 3, there is shown a block diagram of the RPATH circuit 220. The RPATH circuit 220 includes inputs for the UDATAR 222 and LDATAR 224 signals from the reference array 216 and outputs for the UDATABRR 226 and LDATABRR 228 signals to the read reference pre-amplifiers 230, 232 and the verify reference pre-amplifiers 234, 236. In addition, the RPATH circuit 220 includes an array 302, a top circuit 304, a mid circuit 306 and a bottom circuit 308. The RPATH circuit 220 also matches the electrical characteristics of circuitry in the read path 250 which does not change with the sliding bank or large/small sector size such as the logic 260 for programming and erasing. Further, the RPATH circuit 220 is coupled with the state machine and control logic 122 which tells the RPATH circuit 220 which bank 194, 196 is undergoing a read operation and whether the operation is being performed on a large or small sector 256.

Figure 4:
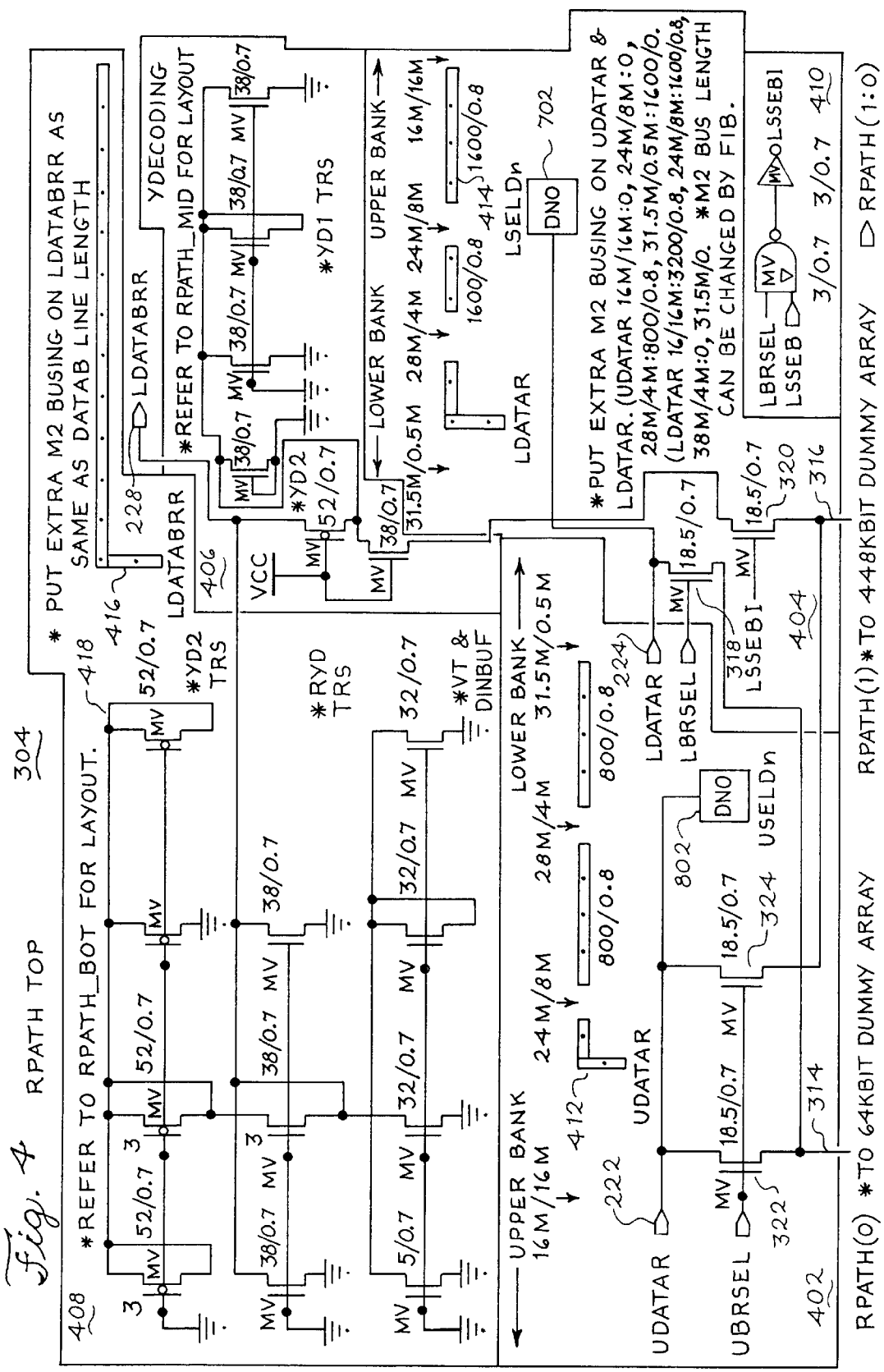
FIG. 4 depicts a schematic diagram of the RPATH_TOP circuit of FIG. 2.

The array circuit 302 provides dummy transistors 902 to equalize the parasitic capacitance of the reference path 254 with that of the read path 250 caused by the non-uniform sector size. The circuit 302 provides a 64 K dummy transistor array 310 and a 448 K transistor array 312. The array circuit 302 connects to the top circuit 304 using the signal paths 314, 316 (labeled "RPATH(0)" and "RPATH(1)"). In the top circuit 304, the array circuit 302 is coupled with the LDATAR signal path 224 using transistors 318 and 320. The array circuit 302 is coupled with the UDATAR signal path 222 using the transistors 322 and 324. Transistor 318 is controlled by the signal labeled "LREAD", from the state machine and control logic 122, which is asserted when the bank 196 is undergoing a read operation. Transistor 320 is controlled by a signal labeled "Large Sector" which is asserted when the sector selected for the read operation is a large sector. When bank 196 is selected for a read operation, the LREAD signal will be asserted connecting the 64 K dummy transistor array 310 to the LDATAR signal path 224. If the selected sector for the read operation is a small sector, the Large Sector signal will be unasserted and only the 64 K dummy transistor array 310 will be attached to the line with its associated parasitic capacitance. However, if the selected sector is a large sector, the Large Sector signal will be asserted, additionally coupling the 448 K dummy transistor array 312 with LDATAR signal path 224. This will effectively place a parasitic capacitance equal to 512 transistors on the reference path 254. Transistors 322 and 324 are controlled by the UREAD signal, from the state machine and control logic 122, which is asserted when bank 194 is selected for a read operation. Assertion of the UREAD signal will couple both the 64 K dummy transistor array 310 and the 448 K dummy transistor array 312 to the UDATAR signal path 222. Bank 194 only has large sectors and therefore the reference path 254 need only match the parasitic capacitance of 512 transistors. The LREAD and UREAD signals are generated by the state machine and control logic 122. The Large Sector signal is generated by internal logic 410 of the top circuit 304 shown in FIG. 4. The top circuit 304 is shown in FIG. 4 and discussed in more detail below. The array circuit 302 is shown in more detail in FIG. 9.

Referring now to FIG. 4, there is shown a schematic diagram of the top circuit 304 (labeled "RPATH_TOP").

The top circuit 304 includes a upper bank equalization circuit 402, a lower bank equalization circuit 404, a lower bank decoder equalization circuit 406 and a lower bank DATAB equalization circuit 408. The upper bank equalization circuit 402 equalizes the parasitic capacitance, capacitance introduced by the metal bit line 212 length and the sector transistor 258 loading of the bank 194. The parasitic capacitance is equalized, as discussed above, by selective coupling of the array circuit 302 with the UDATAR 222 signal path during read operations. The capacitance of the metal bit lines 212 is equalized by the coupling of dummy metalization 412 with the UDATAR 222 signal path. This dummy metalization 412 is fabricated using the second metal layer ("M2 layer") of the fabrication process. The length of the dummy metalization 412 is adjusted to match the length of the metal bit lines 212 of the bank 194 as determined by the bank size. The larger the size of bank 194, the longer the bit lines 212 will be and therefore the longer the dummy metalization 412 must be. It will be appreciated that dummy capacitors or dummy transistors can also be used in place of dummy metalization to match the bit line 212 length capacitance. The following table shows the length of dummy metalization 412 added to UDATAR 222 depending on the bank size:

| Bank 194 Size (Mb) | Length added (microns) × width (microns) |
| --- | --- |
| 16 | 0 |
| 24 | 0 |
| 28 | 800 × 0.8 |
| 31.5 | 1600 × 0.8 |

It will be appreciated that the given lengths are for illustrative purposes only and that the actual lengths needed to match the electrical characteristics of the metal bit lines 212 will vary with the implementation and fabrication process details.

Figure 8:
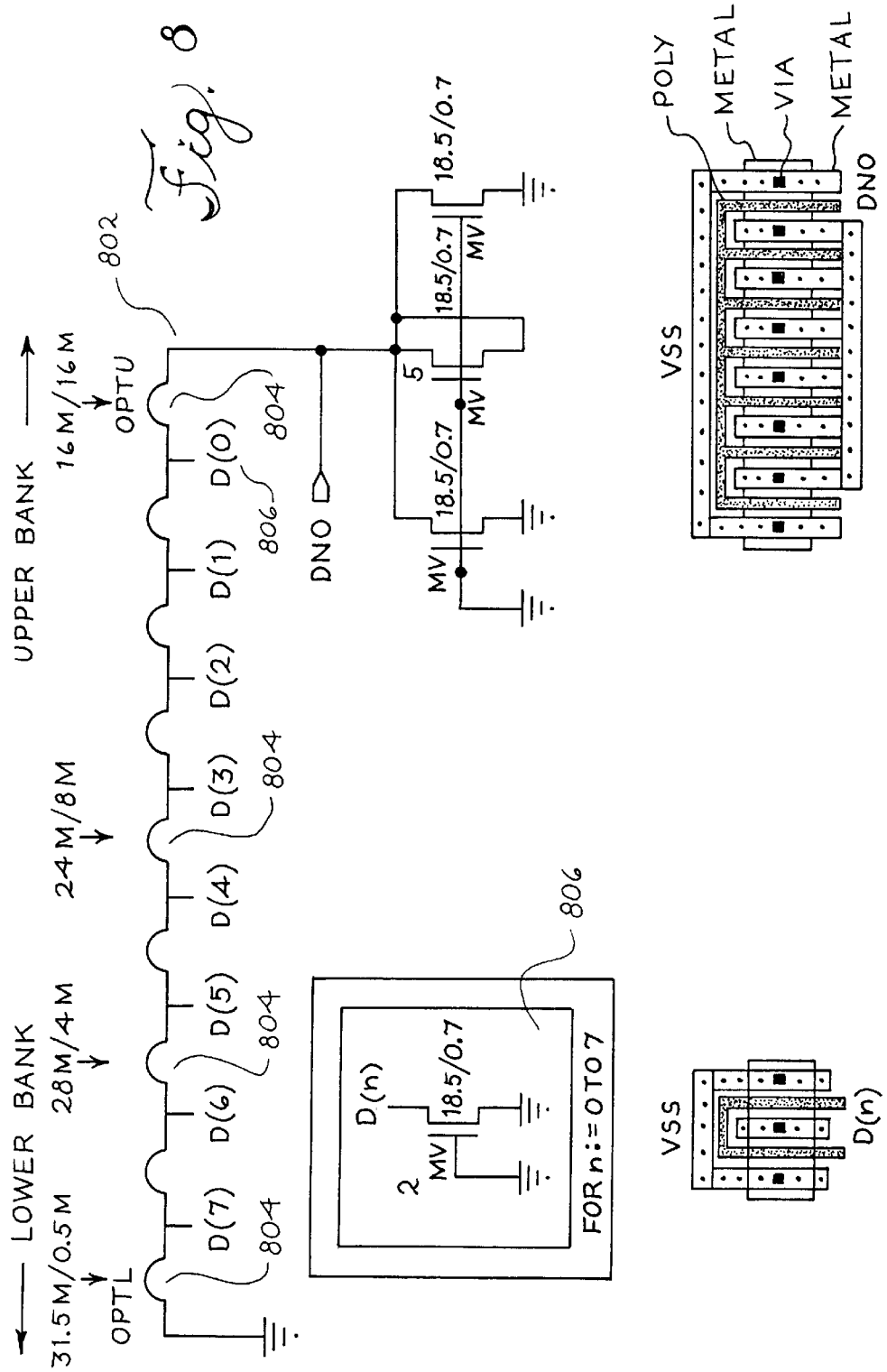
FIG. 8 depicts a schematic diagram of the USELDM circuit of FIG. 2.

The upper bank equalization circuit 402 further includes an upper select transistor dummy circuit 802. This circuit 802 is designed to equalize the sector select transistor 258 loading on the read path. Referring now to FIG. 8, there is shown a schematic diagram of the upper select transistor dummy circuit (labeled "USELDM") 802. The USELDM circuit 802 includes metal option connections 804 and dummy transistors 806. The number of sectors 256 in bank 194, and therefore the number of sector select transistors 258 will vary with the bank size. An appropriate number of dummy transistors 806 are added to the UDATAR signal path 222 based on the bank size. This is done by cutting the metal option connection 804 corresponding to the set bank size. This results in connection of the appropriate load. The metal option connections 804 are implemented using the second metal layer of the fabrication process allowing them to be configured at the same time the bank size is set. It will be appreciated that there are other ways known to those skilled in the art to implement the dummy transistors 806 and the metal option connections 804.

Referring back to FIG. 4, the lower bank equalization circuit 404 equalizes the parasitic capacitance, capacitance introduced by the metal bit line 212 length and the sector transistor 258 loading of the bank 196. The parasitic capacitance is equalized, as discussed above, by selective coupling of the array circuit 302 with the LDATAR 224 signal path during read operations for large and small sectors 256. The capacitance of the metal bit lines 212 is equalized by the coupling of dummy metalization 414 with the LDATAR 224 signal path. This dummy metalization 414 is fabricated using the second metal layer ("M2 layer") of the fabrication process. The length of the dummy metalization 414 is adjusted to match the length of the metal bit lines 212 of the bank 196 as determined by the bank size. The larger the size of bank 196, the longer the bit lines 212 will be and therefore the longer the dummy metalization 414 must be. It will be appreciated that dummy capacitors or dummy transistors can also be used in place of dummy metalization to match the bit line 212 length capacitance. The following table shows the length of dummy metalization 414 added to LDATAR 224 depending on the bank size:

| Bank 196 Size (Mb) | Length added (microns) × width (microns) |
| --- | --- |
| 16 | 3200 × 0.8 |
| 8 | 1600 × 0.8 |
| 4 | 0 |
| 0.5 | 0 |

It will be appreciated that the given lengths are for illustrative purposes only and that the actual lengths needed to match the electrical characteristics of the metal bit lines 212 will vary with the implementation and fabrication process details.

The lower bank equalization circuit 404 further includes a lower select transistor dummy circuit 702. This circuit 702 is designed to equalize the sector select transistor 258 loading on the read path. Referring now to FIG. 7, there is shown a schematic diagram of the lower select transistor dummy circuit (labeled "LSELDM") 702. The LSELDM circuit includes metal option connections 704 and dummy transistors 706. The number of sectors 256 in bank 196, and therefore the number of sector select transistors 258 will vary with the bank size. An appropriate number of dummy transistors 706 are added to the LDATAR signal path 224 based on the bank size. This is done by cutting the metal option connection 704 corresponding to the set bank size. This results in connection of the appropriate load. The metal option connections 704 are implemented using the second metal layer of the fabrication process allowing them to be configured at the same time the bank size is set. It will be appreciated that there are other ways known to those skilled in the art to implement the dummy transistors 706 and the metal option connections 704.

Referring bank to FIG. 4, the remaining circuits of the top circuit 304 are used for equalizing the reference path 254 characteristics for the bank 196 read path 250. The lower bank decoder equalization circuit 406 is used to equalize the load placed on the read path 256 by the Y address decoders 120 for the bank 196. The Y address decoders 120 do not change with the sliding bank size and therefore this circuit does not have to be adjustable. The DATAB signal paths (labeled as "UDATABn" (n=0:15) for bank 194 and "LDATABn" (n=0:15) for bank 196) connect the Y address decoders 114, 120 with the sense amplifiers 174. They also connect the Y address decoders to additional logic 260 used for the erasing and programming functions. The lower bank DATAB equalization circuit 408 equalizes both the length of the LDATABn signal path using fixed dummy metalization 416 as well as the loading on the LDATABn signal path using the dummy transistor circuit 418 coupled with the LDATABRR signal path 228. The loading on the LDATABn signal path which must be equalized includes additional logic of the Y address decoders 120 and the logic 260 for program and erase operations for bank 196. It will be appreciated by those skilled in the art that the LDATABn signal path length and loading will vary with the design implementation and fabrication process and that all methods of matching the electrical characteristics imparted on the read path 250 to the reference path 254 are contemplated. Further, it will be appreciated that the equalization can be achieved by a number of methods including the addition of dummy capacitors and dummy transistors in place of the dummy metal 416. The output of the lower bank DATAB equalization circuit 408 is the LDATABRR signal path 228 which, referring back to FIG. 2, goes to the sense amplifiers 174, 176 of bank 196.

Figure 5:
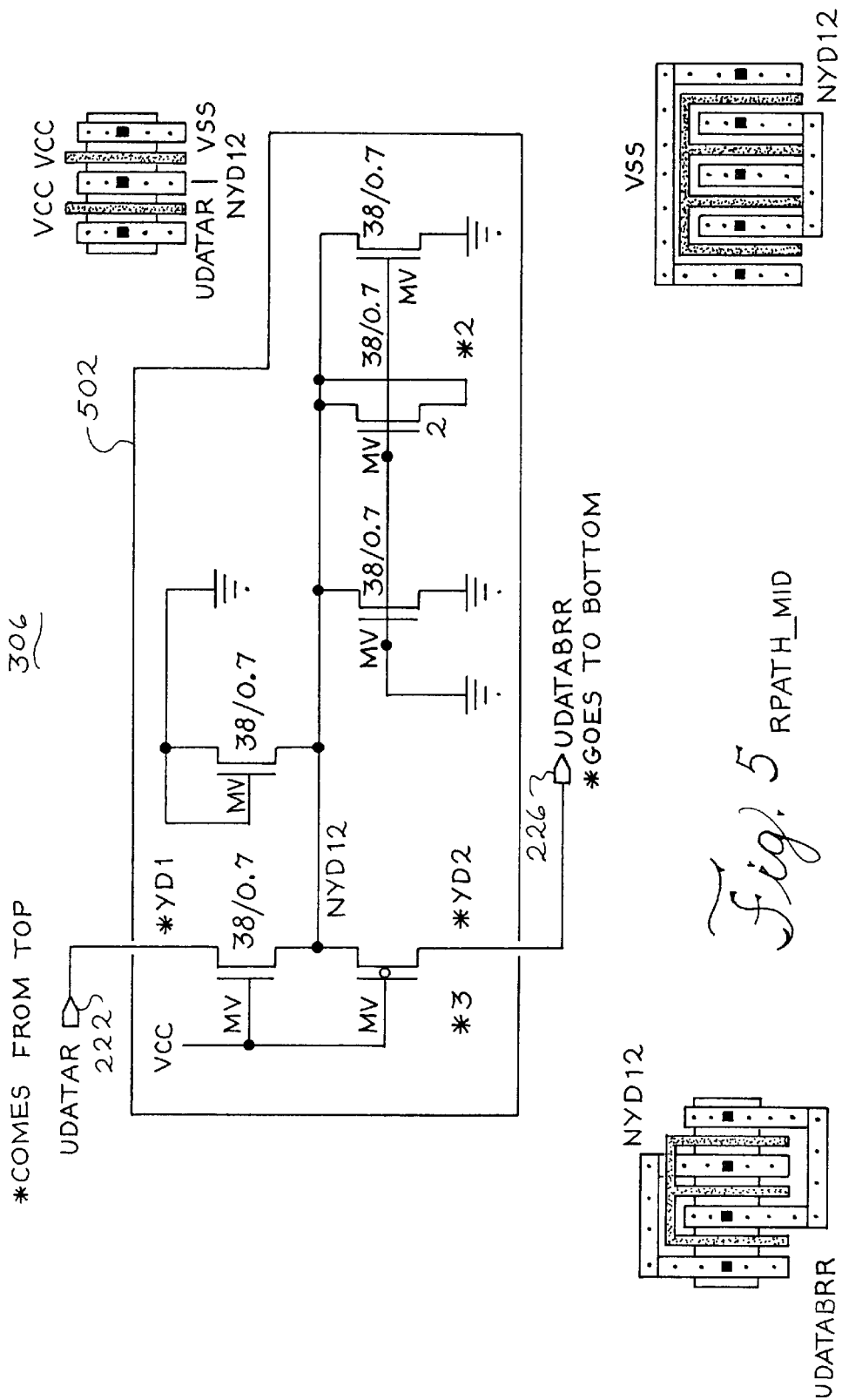
FIG. 5 depicts a schematic diagram of the RPATH_MID circuit of FIG. 2.

Referring now to FIG. 5, there is shown a schematic diagram of the mid circuit 306 (labeled "RPATH_MID"). The mid circuit 306 includes an upper bank decoder equalization circuit 502. The upper bank decoder equalization circuit 406 is used to equalize the load placed on the read path 256 by the Y address decoders 114 for the bank 194. The Y address decoders 120 do not change with the sliding bank size and therefore this circuit does not have to be adjustable. The output of the mid circuit 306 is the UDATABRR signal path 226. Referring back to FIG. 2, this signal path 226, not only goes to the sense amplifiers 174, 176 but also, referring to FIG. 3, goes to the bottom circuit 308. In the memory device 100, this connection from the mid circuit 306 to the bottom circuit 308 is implemented using the first and second metal layers of the fabrication process. This combination of the first and second metal layers as well as the length of the signal path from the mid circuit to the bottom circuit equalizes the electrical characteristics imparted on the read path 250 of bank 194 by the length of the UDATABn line and is similar to the dummy metalization 416 coupled with the LDATABRR signal path 228. It will be appreciated that the equalization can be achieved by a number of alternative methods including the addition of dummy capacitors and dummy transistors in place of the combined metal 1/metal 2 signal path.

Figure 6:
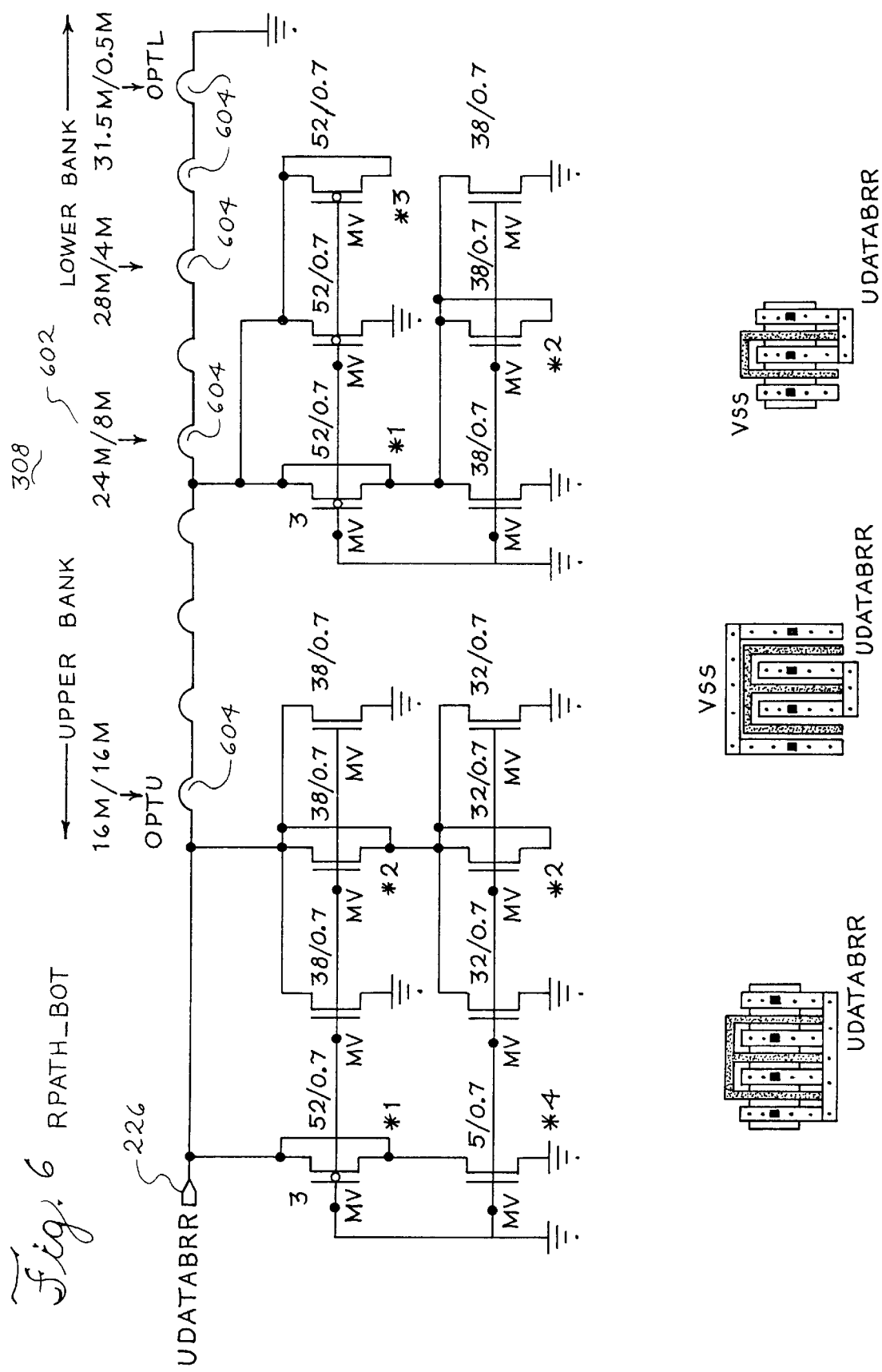
FIG. 6 depicts a schematic diagram of the RPATH_BOT circuit of FIG. 2.

Referring now to FIG. 6, there is shown a schematic diagram of the bottom circuit 308 (labeled "RPATH_BOT"). The bottom circuit 308 includes an upper bank DATAB equalization circuit 602. The upper bank DATAB equalization circuit 602 equalizes the loading on the UDATABn signal path using dummy transistors coupled with the UDATABRR signal path 226. The loading on the UDATABn signal path which must be equalized includes additional logic of the Y address decoders 114 and the logic 260 for program and erase operations for the bank 194. It will be appreciated by those skilled in the art that the UDATABn signal path length and loading will vary with the design implementation and fabrication process and that all methods of matching the electrical characteristics imparted on the read path 250 to the reference path 254 are contemplated. The output of the upper bank DATAB equalization circuit 408 is the UDATABRR signal path 226 which, referring back to FIG. 2, goes to the sense amplifiers 174, 176 for bank 194. Further, because the loading on the UDATABn signal path can vary with the sliding bank size, metal option connections 604 are added which can be severed or connected using the second metal layer of the fabrication process to add additional equalization loading.

Referring now to FIG. 9, there is shown a schematic diagram of the reference path array 302 (labeled "RPATH_ARRAY"). The reference path array 302 includes an array of dummy flash memory transistors 902. The array 902 is divided, as was discussed above, into a 64 K array 310 containing 64 K dummy transistors and a 448 K array 312 containing 448 K dummy transistors. The reference path array 302 is coupled with the top circuit 304 by the RPATH (0) 314 and RPATH(1) signal paths.

As disclosed, the equalization circuits allow the reference path 254 electrical characteristics to be equalized to those of the read path 250 yielding optimal sensing times from the sense amplifiers 174, 176. Further, the equalization can be easily adjusted during fabrication to account for variable banks isizes at the same time that the bank sizes are set. The implementation, using a single set of reference cells 216, also saves die area versus implementing a complete set of reference circuits for each bank 194, 196. Further, the use of dummy transistors and dummy metalization results in equalization circuits which are more immune to process variations then implementing the equalization with capacitors. Finally, the equalization circuits are easily optimized to account for future design changes.

There are a number of ways to implement the equalization circuits described above, including substitution of alternative circuit arrangements which include various combinations of capacitors, transistors and metal lines. In addition, the provision of a second reference path with its own set of reference cells could also be implemented. It will be appreciated by those skilled in the art that the equalization circuits required by the reference path 254 depend on the implementation of the read path 250 and that all methods of equalizing the electrical characteristics between the two, which account for variable banks sizes, are contemplated.

It is to be noted that the transistor sizes specifying channel width to length ratios (measured in micrometers or microns) for the transistors which make up the depicted circuits are for illustrative purposes only. It will be appreciated that suitable ratios may be chosen depending on the design requirements, simulation results and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A flash memory device comprising:
    a first memory bank having a first bank size and comprising a first read path defining a first read path electrical characteristic;
    a second memory bank having a second bank size and comprising a second read path defining a second read path electrical characteristic;
    a reference circuit comprising:
        a reference cell;
        a first reference path coupled with said reference cell and with said first read path and defining a first reference path electrical characteristic; and
        a second reference path coupled with said reference cell and coupled with said second read path and defining a second reference path electrical characteristic;
    said flash memory device further comprising:
    a first reference equalization circuit coupled with said reference circuit and operative to equalize said first read path electrical characteristic with said first reference path electrical characteristic; and
    a second reference equalization circuit coupled with said reference circuit and operative to equalize said second read path electrical characteristic with said second reference path electrical characteristic.

2. The flash memory device of claim 1, wherein said flash memory device is capable of simultaneous read/write operation.

3. The flash memory device of claim 1, wherein said first and second bank sizes are variable.

4. The flash memory device of claim 3, wherein:
said first read path electrical characteristic varies with said first bank size; and
said second read path electrical characteristic varies with said second bank size.

5. The flash memory device of claim 1, wherein said first memory bank is the same bank as said second memory bank.

6. The flash memory device of claim 1, wherein:
said first read path electrical characteristic comprises a first read path bit line length;
said second read path electrical characteristic comprises a second read path bit line length;
said first reference path electrical characteristic comprises a first reference path bit line length; and
said second reference path electrical characteristic comprises a second reference path bit line length.

7. The flash memory device of claim 6, wherein said first and second bank sizes are variable and further wherein:
said first read path bit line length varies with said first bank size; and
said second read path bit line length varies with said second bank size.

8. The flash memory device of claim 7, wherein said first and second reference equalization circuits are operative to equalize the path bit line length of said first and second reference paths to the path bit line length of said first and second read paths.

9. The flash memory device of claim 8, wherein said first and second reference equalization circuits comprise dummy metalization.

10. The flash memory device of claim 8, wherein said first and second reference equalization circuits comprise dummy capacitors.

11. The flash memory device of claim 8, wherein said first and second reference equalization circuits comprise dummy transistors.

12. The flash memory device of claim 6, wherein:
said first reference equalization circuit comprises first dummy metalization coupled with said first reference path; and
said second reference equalization circuit comprises second dummy metalization coupled with said second reference path.

13. The flash memory device of claim 12, wherein said first and second dummy metalization is fabricated from the second metal layer of the fabrication process.

14. The flash memory device of claim 12, wherein said first and second dummy metalization are fabricated as one of the final steps of fabrication of said flash memory device.

15. The flash memory device of claim 12, wherein said first and second dummy metalization are operative to extend the path bit line length of said first and second reference paths.

16. The flash memory device of claim 12, wherein said first and second dummy metalization are operative to increase capacitance of said first and second reference paths.

17. The flash memory device of claim 12, wherein said first and second dummy metalization are adjustable after fabrication.

18. The flash memory device of claim 1, wherein:
said first read path electrical characteristic comprises a first read path loading;
said second read path electrical characteristic comprises a second read path loading;
said first reference path electrical characteristic comprises a first reference path loading; and
said second reference path electrical characteristic comprises a second reference path loading.

19. The flash memory device of claim 18, wherein:
said first reference equalization circuit comprises a first dummy load circuit coupled with said first reference path; and
said second reference equalization circuit comprises a second dummy load circuit coupled with said second reference path.

20. The flash memory device of claim 19, wherein the loading of said first and second dummy load circuits is adjustable.

21. The flash memory device of claim 20, wherein:
said first and second dummy load circuits comprise one or more dummy load transistors; and further wherein the number of said one or more dummy load transistors coupled with said first and second reference paths is adjustable using a second metal layer.

22. The flash memory device of claim 19, wherein:
said first dummy load circuit is operative to increase the loading of said first reference path; and
said second dummy load circuit is operative to increase the loading of said second reference path.

23. The flash memory device of claim 19, wherein:
said first dummy load circuit is operative to increase the capacitance of said first reference path; and
said second dummy load circuit is operative to increase the capacitance of said second reference path.

24. The flash memory device of claim 1, wherein:
said first read path electrical characteristic comprises a first read path parasitic capacitance;
said second read path electrical characteristic comprises a second read parasitic capacitance length;
said first reference path electrical characteristic comprises a first reference path parasitic capacitance; and
said second reference path electrical characteristic comprises a second reference path parasitic capacitance.

25. The flash memory device of claim 24, wherein:
said first reference equalization circuit comprises a first dummy capacitance circuit coupled with said first reference path; and
said second reference equalization circuit comprises a second dummy capacitance circuit coupled with said second reference path.

26. The flash memory device of claim 25, wherein the parasitic capacitance of said first and second dummy capacitance circuits is adjustable.

27. The flash memory device of claim 25, wherein:
said first dummy capacitance circuit is operative to increase the parasitic capacitance of said first reference path; and
said second dummy capacitance circuit is operative to increase the parasitic capacitance of said second reference path.

* * * * *